(12) United States Patent
Saeki et al.

(10) Patent No.: US 6,988,867 B2
(45) Date of Patent: Jan. 24, 2006

(54) TRANSFER APPARATUS

(75) Inventors: Hiroaki Saeki, Nirasaki (JP); Teruo Asakawa, Tokyo-To (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/387,467

(22) Filed: Mar. 14, 2003

(65) Prior Publication Data
US 2004/0062632 A1    Apr. 1, 2004

(30) Foreign Application Priority Data
Sep. 30, 2002   (JP) .............................. 2002-286797

(51) Int. Cl.
*B25J 18/04* (2006.01)
(52) U.S. Cl. .............................. 414/744.5; 414/749.1; 901/15; 74/490.09
(58) Field of Classification Search ............. 414/745.5, 414/749.1; 74/490.01, 490.05, 490.09; 901/15, 901/28
See application file for complete search history.

(56) References Cited

U.S. PATENT DOCUMENTS 5,180,276 A    1/1993   Hendrickson
5,447,409 A    9/1995   Grunes et al.
5,720,590 A    2/1998   Hofmeister

FOREIGN PATENT DOCUMENTS

| JP | 4-129685 | | 4/1992 |
| JP | 6-15592 | | 1/1994 |
| WO | WO 00/05762 | * | 2/2000 |

OTHER PUBLICATIONS

ISSM '96 article, "A Water-handling Interface that operates under Process Chamber Ambient Conditions", Oct. 1996.*

* cited by examiner

*Primary Examiner*—Donald W. Underwood
(74) *Attorney, Agent, or Firm*—Smith, Gambrell & Russell, LLP (57) ABSTRACT

There is provided a transfer apparatus capable of increasing the length of a transfer arm when it is extended, without increasing the size of the transfer arm when it is contracted. The transfer apparatus 4 comprising a transfer arm 17 which comprises: two rotating shafts 5 and 6 arranged coaxially or in parallel; a pair of first arms 7 and 8, one end portions of which are fixed to the rotating shafts 5 and 6, respectively; a pair of second arms 10 and 11, one end portions of which are connected to the other end portions of the pair of first arms 7 and 8 by means of pins, respectively; and a holding portion 14 for holding an object w to be processed, the holding portion 14 being connected to each of the other end portions of the pair of second arms 10 and 11 by means of pins, wherein the second arms 10 and 11 cross each other.

5 Claims, 7 Drawing Sheets

TRANSFER APPARATUS

BACKGROUND OF THE INVENTION

1. Technical Field of the Invention

The present invention generally relates to the improvement of a transfer apparatus having a so-called frog-leg type transfer arm.

2. Description of the Related Art

For example, in the production of a semiconductor device, a transfer apparatus for transferring an object to be processed, e.g. a semiconductor wafer. As examples thereof, transfer apparatuss having a frog-leg type transfer arm are disclosed in Japanese Patent Laid-Open No. 4-129685 (the former) and Japanese Patent Laid-Open No. 6-15592 (the latter).

The transfer apparatus disclosed in the former publication comprises a transfer arm which comprises: a pair of small rotating shafts comprising two parallel shafts which are provided on a large rotating shaft at an interval and which simultaneously rotate in different directions; first arms, one end portions of which are fixed to the pair of small rotating shafts; second arms, one end portions of which are connected to the other end portions of the first arms by means of a pin; and a pick for holding a wafer, the pick being connected to the other end portions of the second arms by means of a pin. In addition, the other end portions of the first arms are connected to one end portions of third arms, which are directed in the opposite direction to the second arms, by means of a pin, and the other end portions of the thirds arm are connected to the pick by means of a pin.

The transfer apparatus disclosed in the latter publication comprises: a central hub; a pair of arms which are arranged so as to rotate coaxially with the hub; two picks which are spaced from each other by 180 degrees; a joint linkage for connecting each of the picks to one end portion of a corresponding one of the arms; and a drive unit for rotating the arms in opposite directions to extend one or the other of picks from the central hub in a radial direction and for rotating the arms in the same direction to coaxially rotate the picks. This transfer apparatus is provided in, e.g., the central portion of a transfer chamber, and is designed to move and transfer a wafer to a processing chamber, a load-lock chamber and so forth, which are arranged around the transfer chamber, by combining the rotation of the transfer arm while being contracted with the elongation and contraction of the transfer arm.

However, both of the above described transfer apparatuss can not sufficiently increase the length of the transfer arm when it is extended, considering the size of the transfer arm when it is contracted. In other words, if the length of each arm is increased in order to increase the length of the transfer arm when it is extended, the size of the transfer arm when it is contracted is increased, so that there is a problem in that the size of the transfer chamber for rotatably housing the transfer arm in its contracted state is unavoidably increased.

SUMMARY OF THE INVENTION

It is therefore an object of the present invention to eliminate the aforementioned problem and to provide a transfer apparatus capable of increasing the length of a transfer arm when it is extended, without increasing the size of the transfer arm when it is contracted.

In order to accomplish the aforementioned and other objects, according to a first aspect of the present invention, a transfer apparatus comprises a transfer arm which comprises: two rotating shafts arranged coaxially or in parallel; a pair of first arms, one end portions of which are fixed to the rotating shafts, respectively; a pair of second arms, one end portions of which are connected to the other end portions of the pair of first arms by means of pins, respectively; and a holding portion for holding an object to be processed, the holding portion being connected to each of the other end portions of the pair of second arms by means of pins, wherein the second arms cross each other.

In the first aspect of the present invention, the transfer apparatus may further comprise a second transfer arm which comprises: a pair of third arms which face in directions opposite to the second arms, one end portions of the third arms being connected to the other end portions of the pair of first arms by means of pins, respectively; and a second holding portion for holding the object to be processed, the second holding portion being connected to each of the other end portions of the pair of third arms by means of pins, wherein the third arms cross each other.

According to a second aspect of the present invention, a transfer apparatus comprising a transfer arm which comprises: two parallel rotating shafts; a pair of first arms, one end portions of which are fixed to the rotating shafts, respectively; a pair of second arms, one end portions of which are connected to the other end portions of the pair of first arms by means of pins, respectively; and a holding portion for holding an object to be processed, the holding portion being connected to each of the other end portions of the pair of second arms by means of pins, wherein the first arms cross each other.

In the second aspect of the present invention, the transfer apparatus may further comprise a second transfer arm which comprises: a pair of third arms which face in directions opposite to the second arms, one end portions of the third arms being connected to the other end portions of the pair of first arms by means of pins, respectively; and a second holding portion for holding the object to be processed, the second holding portion being connected to each of the other end portions of the pair of third arms by means of pins.

In the second aspect of the present invention, one of the first arms may have a bypass portion for avoiding interference with a rotating shaft of the other of the first arms.

According to a third aspect of the present invention, a transfer apparatus comprises a transfer arm which comprises: a pair of movable bodies which are moved so as to approach and leave each other; a pair of arms, one end portions of which are connected to the pair of movable bodies by pins, respectively; and a holding portion for holding an object to be processed, the holding portion being connected to each of the other end portions of the pair of arms by means of pins, wherein the arms cross each other.

DESCRIPTION OF THE PREFERRED EMBODIMENTS

Figure 1:
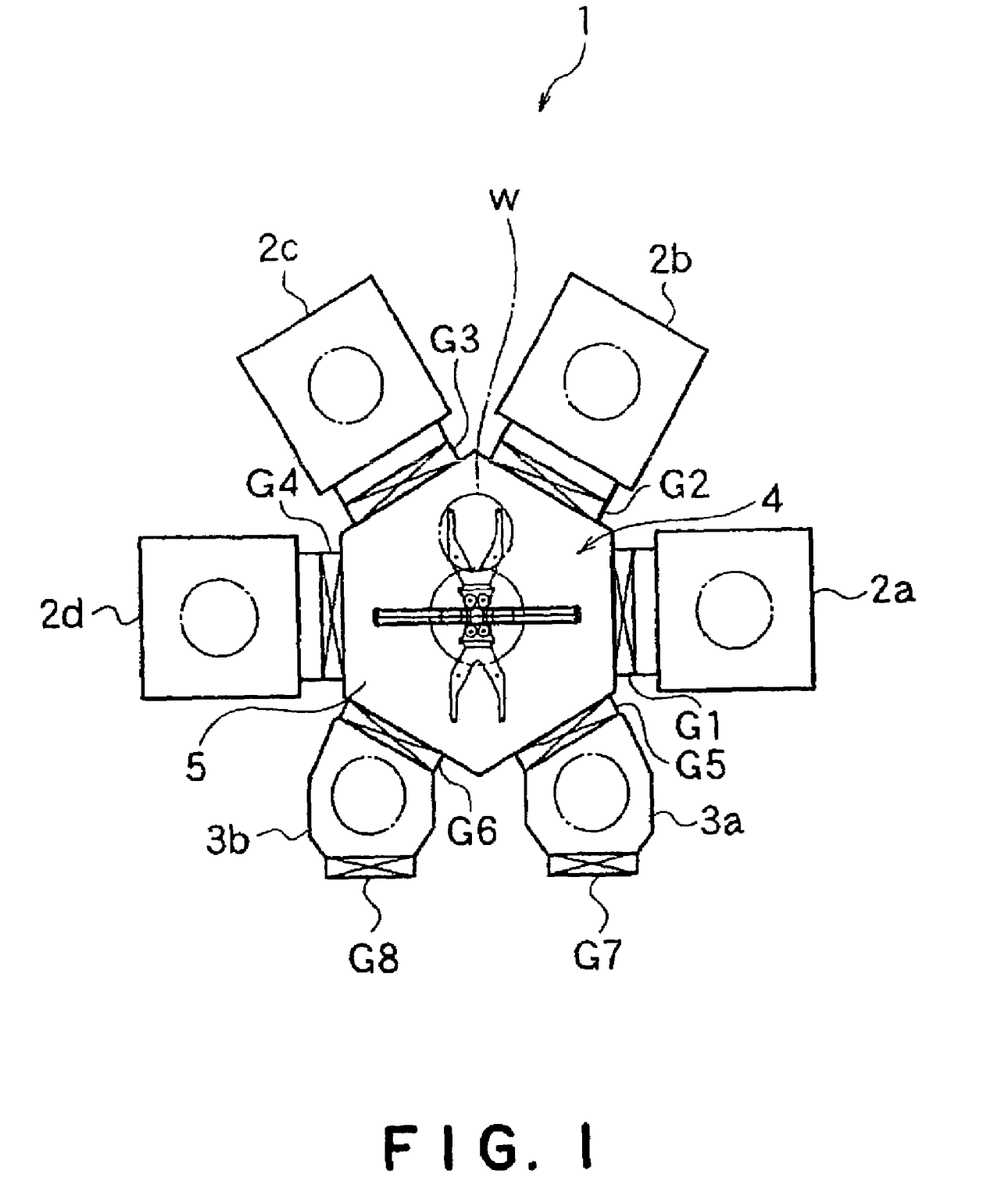
FIG. 1 is a schematic diagram showing an example of a processing apparatus with the first preferred embodiment of a transfer apparatus according to the present invention.
Figure 2:
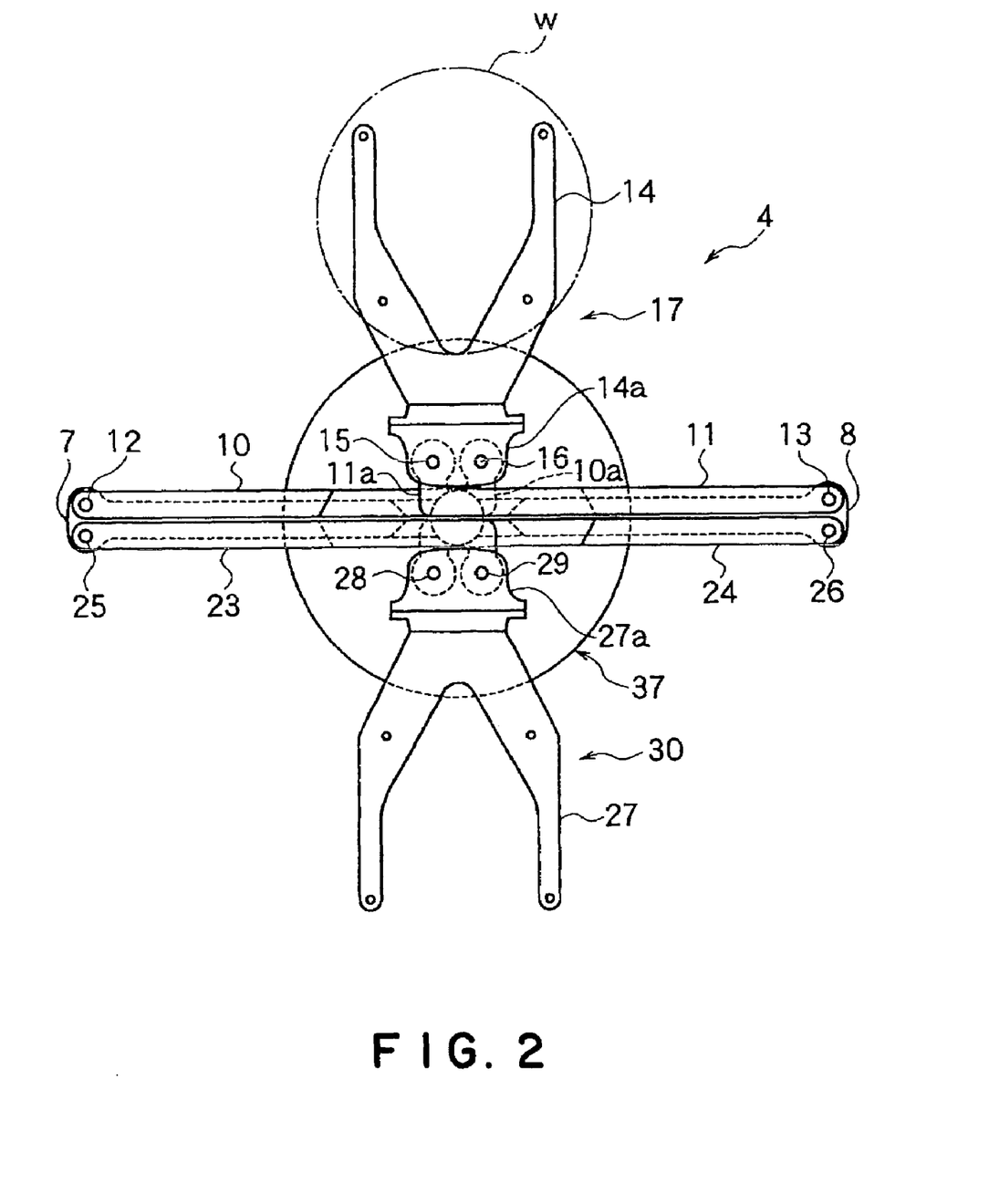
FIG. 2 is a plan view of the transfer apparatus of FIG. 1.
Figure 3:
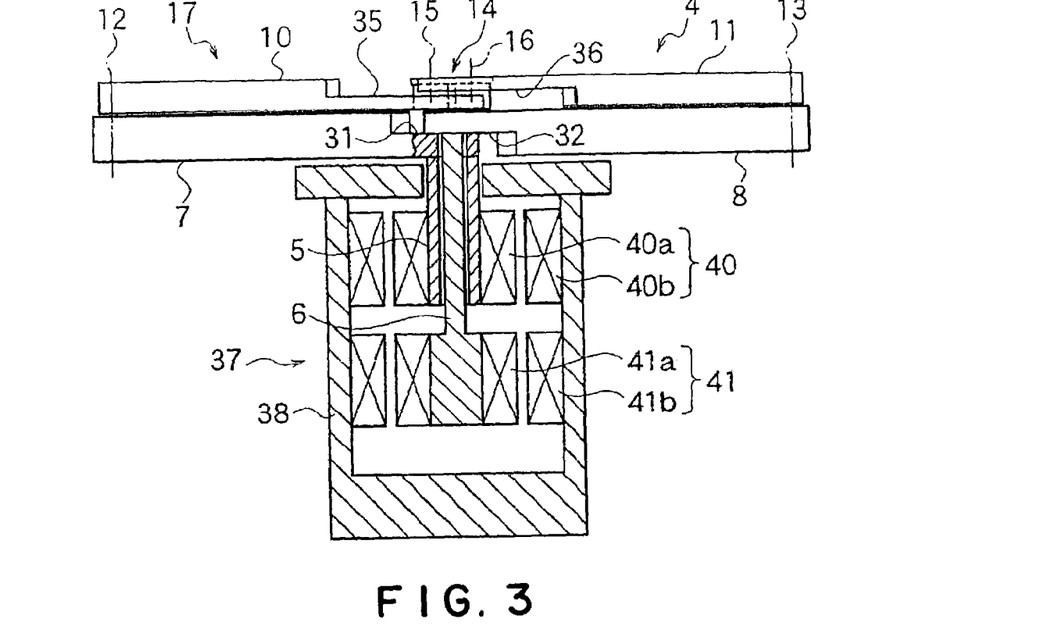
FIG. 3 is a longitudinal sectional view of FIG. 2.
Figure 4:
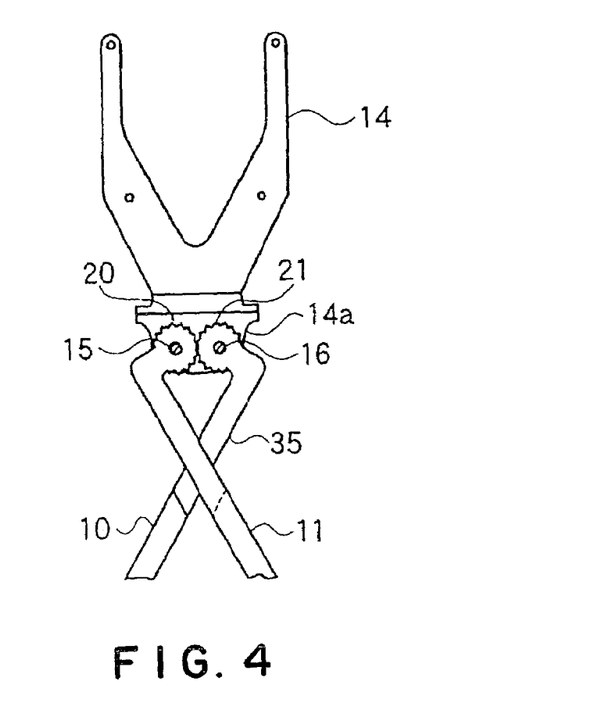
FIG. 4 is a plan view showing an example of a synchronism inverting means for a pair of tip links which are connected to the base portion of a pick by means of pins.
Figure 5:
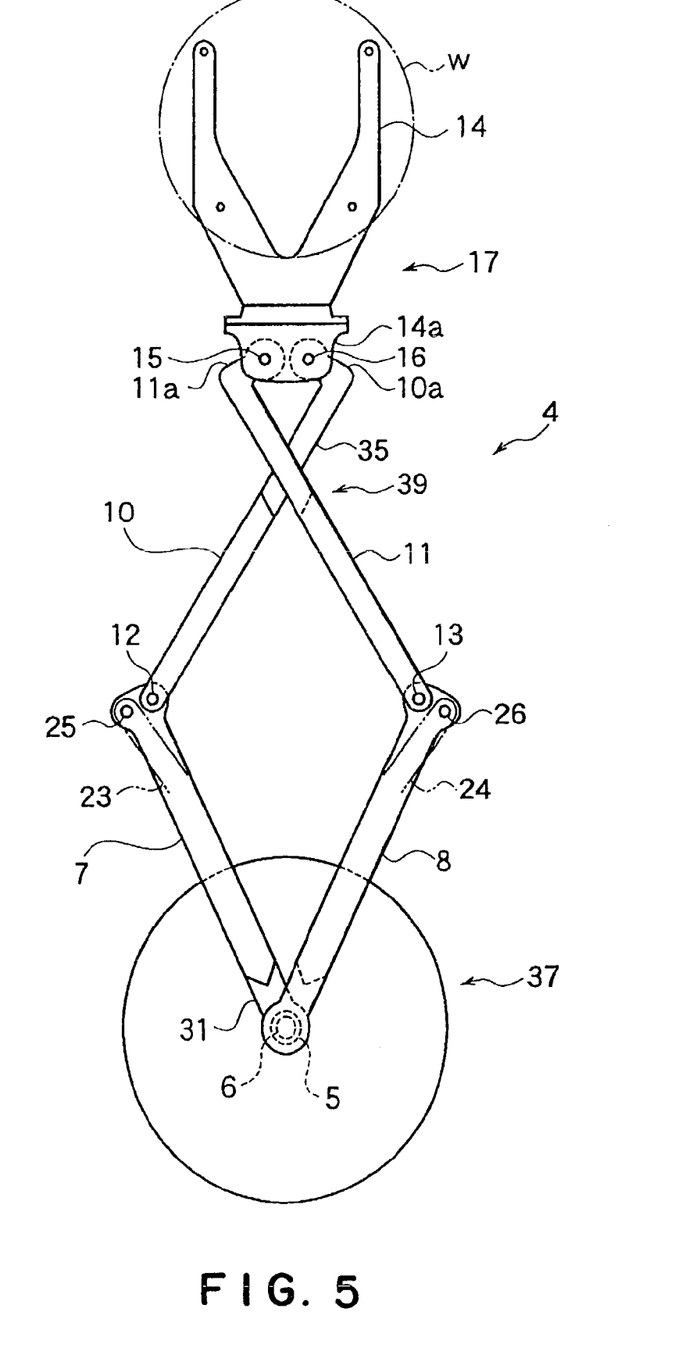
FIG. 5 is a plan view showing a state that a transfer arm is extended.

Referring now to the accompanying drawings, the preferred embodiments of the present invention will be described below in detail. FIG. 1 is a schematic diagram showing an example of a processing apparatus with the first preferred embodiment of a transfer apparatus according to the present invention, and FIG. 2 is a plan view of the transfer apparatus of FIG. 1. FIG. 3 is a longitudinal sectional view of FIG. 2, and FIG. 4 is a plan view showing an example of a synchronism inverting means for a pair of second arms which are connected to a base portion of a pick by means of pins. FIG. 5 is a plan view showing a state that a transfer arm is extended.

In FIG. 1, reference number 1 denotes a vacuum processing apparatus which is an example of a processing apparatus. The vacuum processing apparatus 1 comprises: a plurality of processing chambers 2 (four processing chambers 2a, 2b, 2c and 2d in this shown embodiment), each of which houses therein an object to be processed, e.g. a semiconductor wafer W, one by one to carry out a predetermined processing; a transfer chamber 5 having a transfer apparatus 4 for transferring the wafer W to each of processing chambers 2a, 2b, 2c and 2d and load-lock chambers 3a and 3b which will be described later; and, e.g. two load-lock chambers 3a and 3b for carrying the wafer W in and out of the transfer chamber 5 from and to the outside at atmospheric pressure.

The plane shape of the transfer chamber 5 is substantially hexagon. The processing chambers 2a, 2b, 2c and 2d are connected to four surfaces of the peripheral surfaces of the transfer chamber 5 via gate valves G1 through G4, respectively. The load-lock chambers 3a and 3b for carrying the wafer W in and out thereof are connected to other two surfaces of the peripheral surfaces of the transfer chamber 5 via gate valves G5 and G6, respectively. The load-lock chambers 3a and 3b have wafer inlets, which are formed so as to face the outside, and gate valves G7 and G8 for opening and closing the wafer inlets, respectively.

The processing chambers 2a, 2b, 2c, 2d and the load lock chambers 3a, 3b are radially arranged around the transfer chamber 5. The transfer apparatus 4 is arranged in the central portion of the transfer chamber 5. The transfer apparatus 4 has a transfer arm (a first transfer arm) 17 which comprises: first arms 7 and 8, one end portions of which are fixed to rotating shafts 5 and 6 comprising coaxial or parallel two shafts (coaxial shafts in this embodiment); second arms 10 and 11, one end portions of which are connected to the other end portions of the first arms 7 and 8 by means of pins 12 and 13, respectively, so as to be rotatable in horizontal plane; and a holding portion (a first holding portion), e.g. a pick (a first pick), 14 for holding an object to be processed, e.g. a semiconductor wafer W, the holding portion 14 being connected to the other end portions of the second arms 10 and 11 by means of pins 15 and 16, respectively, so as to be rotatable in horizontal plane. Furthermore, shafts may be substrates for the pins.

Figure 9:
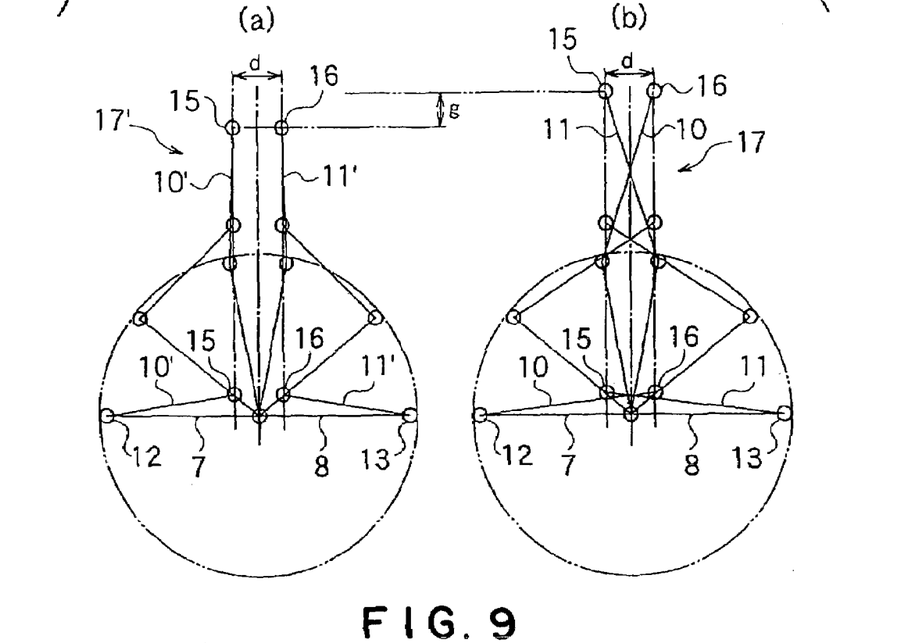
FIG. 9 is a schematic illustration which compares a transfer stroke of a transfer apparatus according to the present invention with a transfer stroke of a conventional transfer apparatus.

Particularly in order to increase the length of the transfer arm 17 when it is extended, without increasing the size of the transfer arm 17 when it is contracted, the second arms 10 and 11 cross each other. That is, in the transfer arm 17' of the conventional transfer apparatus, the second arms 10' and 11' do not cross each other as shown in FIG. 9(a), whereas, in the transfer arm 17 of the transfer apparatus in this preferred embodiment, the second arms 10 and 11 cross each other as shown in FIG. 9(b). In FIGS. 9(a) and 9(b), the distance d's between the tip end portions (the other end portions) of the second arms 10(10') and 11(11') connected to the pick 14 (between the pins) are the same. However, the second arms 10 and 11 are designed to cross each other in the contracted state to cause the tip end portions thereof to be connected to the pins 15 and 16, so that the length of each of the second arms 10 and 11 is substantially increased by the distance between the pins 15 and 16. Thus, the length of the transfer arm 17 of the transfer apparatus in this preferred embodiment when it is extended can be longer by a length g than that of the transfer arm 17' of the conventional transfer apparatus.

In order to hold the direction of the pick 14 in radial directions (extended directions) regardless of the extending/contracting motion of the transfer arm 17, gears 20 and 21 engaging each other are formed on the tip end portions of the pair of second arms 10 and 11, which are connected to the base portion 14a of the pick 14 by means of the pins 15 and 16, as a synchronism inverting means for synchronizing the rotation of one of the tip end portions of the second arms 10 and 11 with another in opposite directions, as shown in FIG. 4. As the synchronism inverting means, belt pulleys may be formed on the tip end portions of the second arms 10 and 11 to wind one endless belt between the belt pulleys in a figure-of-eight form, or to arrange two metal belts, e.g., stainless belts, between the belt pulleys at vertically shifted positions to wind the belts in S-shape in opposite directions to fix both ends of each of the belts to the belt pulleys, respectively. In order to prevent one second arm 10 from interfering with the pin 15 of the other second arm 11 when it is contracted, due to the crossing of the second arms 10 and 11, the tip end portions of the second arms 10 and 11 are preferably formed with protruding portions 10a and 11a which are bent in directions substantially perpendicular thereto to protrude in extended directions and which are connected to the base portion of the pick 14 via the pins 15 and 16.

The transfer apparatus may be a single type transfer apparatus having one transfer arm 17, or may be a dual type transfer apparatus having two transfer arms in opposite directions by 180 degrees as this embodiment. The dual type can further improve the transfer efficiency and throughput than the single type. In this case, it is assumed that the pick (holding portion) 14 is a first pick (holding portion) and the transfer arm 17 is a first transfer arm. One end portions of third arms 23 and 24 facing in directions opposite to the second arms 10 and 11 are connected to the other end portions of the first arms 7 and 8 in the vicinity of the pin connecting portions of the second arms 10 and 11 by means of pins 25 and 26, respectively, and the second pick (holding portion) 27 for holding a wafer W is connected to the other end portions of the third arms 23 and 24 by means of pins 28 and 29. In order to increase the length of the second transfer arm 30 when it is extended, the third arms 23 and 24 cross each other similar to the second arms 10 and 11. The detailed structure of the second transfer arm 30 is the same as that of the first transfer arm 17, and the detailed structure of the second transfer arm 30 is omitted in FIG. 4 and FIG. 5.

The first arms 7 and 8 supporting the second arms 10, 11 and third arms 23, 24 are thick so as to have high strength. In order to prevent the vertical size from being increased by the vertical overlapping of the base end portions (one end portions) of the first arms 7 and 8 with each other, stepped portions (cut-out portions) 31 and 32 are preferably formed by cutting portions out of the overlapping surface of the base end portions of the first arms 7 and 8 by half of the thickness. In order to prevent the vertical size from being increased by the vertical overlapping of the second arms 10 and 11 with each other in a crossing portion 39, stepped portions (cut-out portions) 35 and 36 are preferably formed by cutting portions out of the overlapping surface on the tip end side from the crossing portion of the second arms 10 and 11.

The transfer apparatus 4 comprises a drive unit (drive means) for driving the rotating shafts 5 and 6. FIG. 3 shows an example of the drive unit. The drive unit 37 has a housing 38. In this housing 38, two electric motor sections 40 and 41 are arranged up and down. The motor sections 40, 41 comprise rotors 40a, 41a, and stators 40b, 41b, respectively. The stators 40b and 41b are fixed within the housing 38. The rotating shafts 5 and 6 comprise a first cylindrical rotating shaft 5, and a second rotating shaft 6 rotatably inserted into the first rotating shaft 5. The rotor 40a of the upper (first) motor section 40 is mounted on the first rotating shaft 5. The second rotating shaft 6 protrudes from the bottom end of the first rotating shaft 5. On the protruding portion, the rotor 41a of the lower (second) motor section 41 is mounted. By rotating the first arms 7 and 8 in opposite directions by means of the two motor sections 40 and 41, one (first) or the other (second) transfer arm 17 or 30 can be extended outwardly in a radial direction from the contracted state, or can be contracted inwardly in the radial direction from the extended state. By rotating the first arms 7 and 8 in the same direction, the transfer arms 17 and 30 can be rotated (pivoted) around the coaxial rotating shafts 5 and 6. The rotation of the transfer arms 17 and 30 is carried out in a state that the transfer arms 17 and 30 are contracted, in order to prevent the transfer arms 17 and 30 from contacting the inner peripheral surface of the transfer chamber 5.

According to the transfer apparatus 4 with the above described construction, it is possible to increase the length of the transfer arm 17 when it is extended, without increasing (changing) the size of the transfer arm 17 when it is contracted, since the second arms 10 and 11 cross each other in the transfer apparatus 4 comprising the transfer arm 17 which comprises: the first arms 7 and 8, the one end portions of which are fixed to the coaxial or parallel two rotating shafts 5 and 6, respectively; the second arms 10 and 11, the one end portions of which are connected to the other end portions of the first arms 7 and 8 by means of the pins, respectively; and the holding portion, e.g. the pick 14, for holding an object to be processed, e.g. a wafer W, the holding portion being connected to the other end portions of the second arms 10 and 11 by the pins.

That is, in the transfer arm 17' of the conventional transfer apparatus, the second arms 10' and 11' do not cross each other as shown in FIG. 9(a), whereas, in the transfer arm 17 of the transfer apparatus in this preferred embodiment, the second arms 10 and 11 cross each other as shown in FIG. 9(b). In FIGS. 9(a) and 9(b), the distance d's between the tip end portions (the other end portions) of the second arms 10(10') and 11(11') connected to the pick 14 (between the pins) are the same. However, the second arms 10 and 11 are designed to cross each other in the contracted state to cause the tip end portions thereof to be connected to the pins 15 and 16 on the opposite side, so that the length of each of the second arms 10 and 11 is substantially increased by the distance between the pins 15 and 16. Thus, the length of the transfer arm 17 of the transfer apparatus in this preferred embodiment when it is extended can be longer than that of the transfer arm 17' of the conventional transfer apparatus. In other words, if the length of the transfer arm 17 when it is extended is the same as that of the conventional transfer arm 17', the size of the transfer arm 17 when it is contracted can be small, and the turning radius in the contracted state can be small, so that the transfer chamber 5 can be miniaturized or compacted.

It is also possible to increase the length of the transfer arms 17 and 30 when it is extended, without increasing the size of the transfer arms 17 and 30 when it is contracted, since the third arms 23 and 24 cross each other in the transfer apparatus having the two transfer arms 17 and 30, the second transfer arm 30 comprising: the third arms 23 and 24, the one end portions of the third arms 23 and 24 facing in directions opposite to the second arms 10 and 11 being connected to the other end portions of the first arms 7 and 8 by means of the pins, respectively; and the second pick 27 for holding the wafer W, the second pick 27 being connected to the other end portions of the third arms 23 and 24 by means of the pins.

Figure 6:
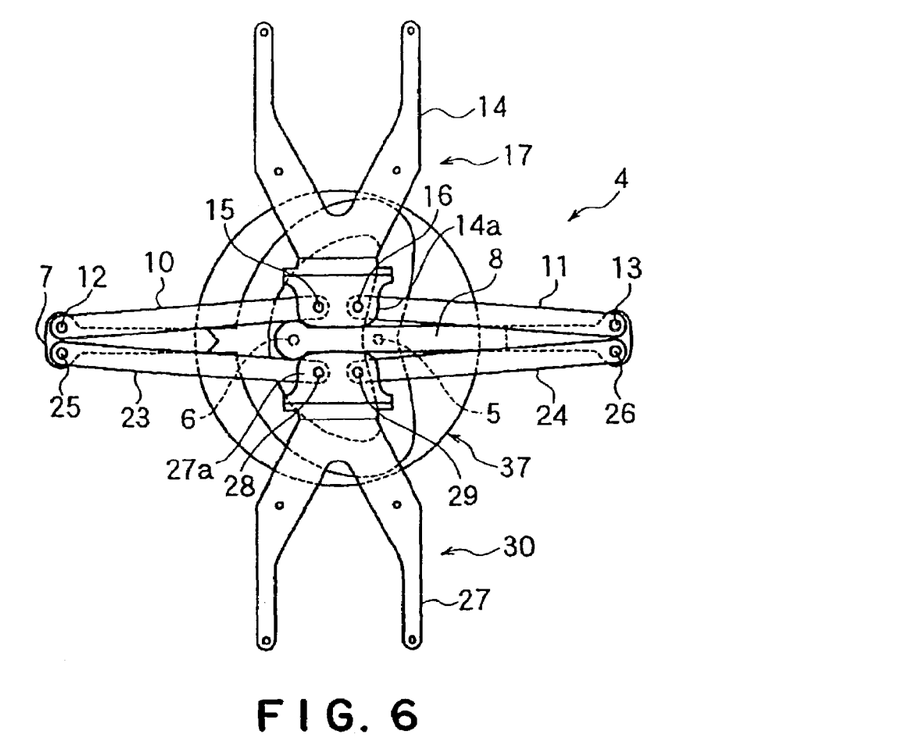
FIG. 6 is a plan view showing the second preferred embodiment of a transfer apparatus according to the present invention.
Figure 7:
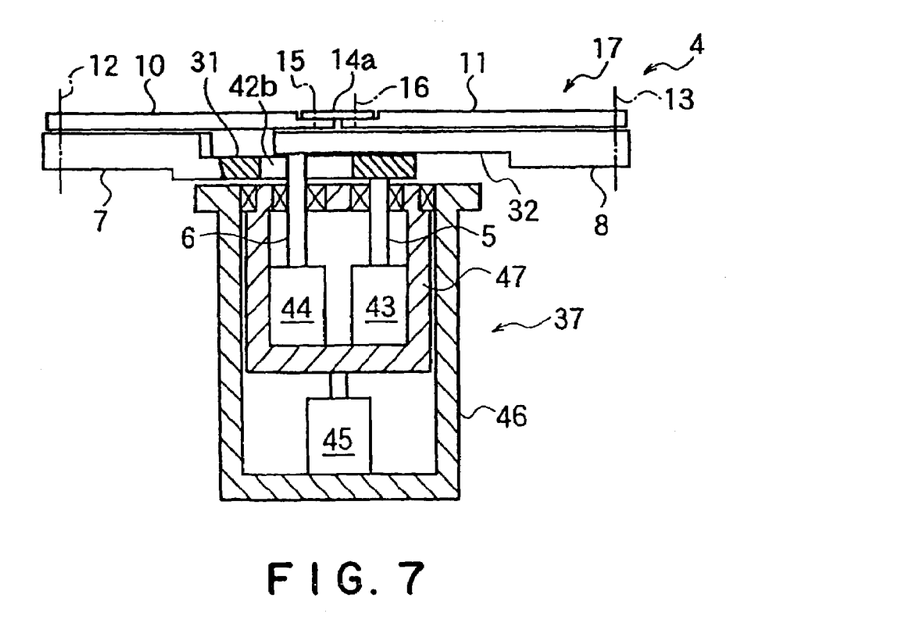
FIG. 7 is a longitudinal sectional view of FIG. 6.
Figure 8:
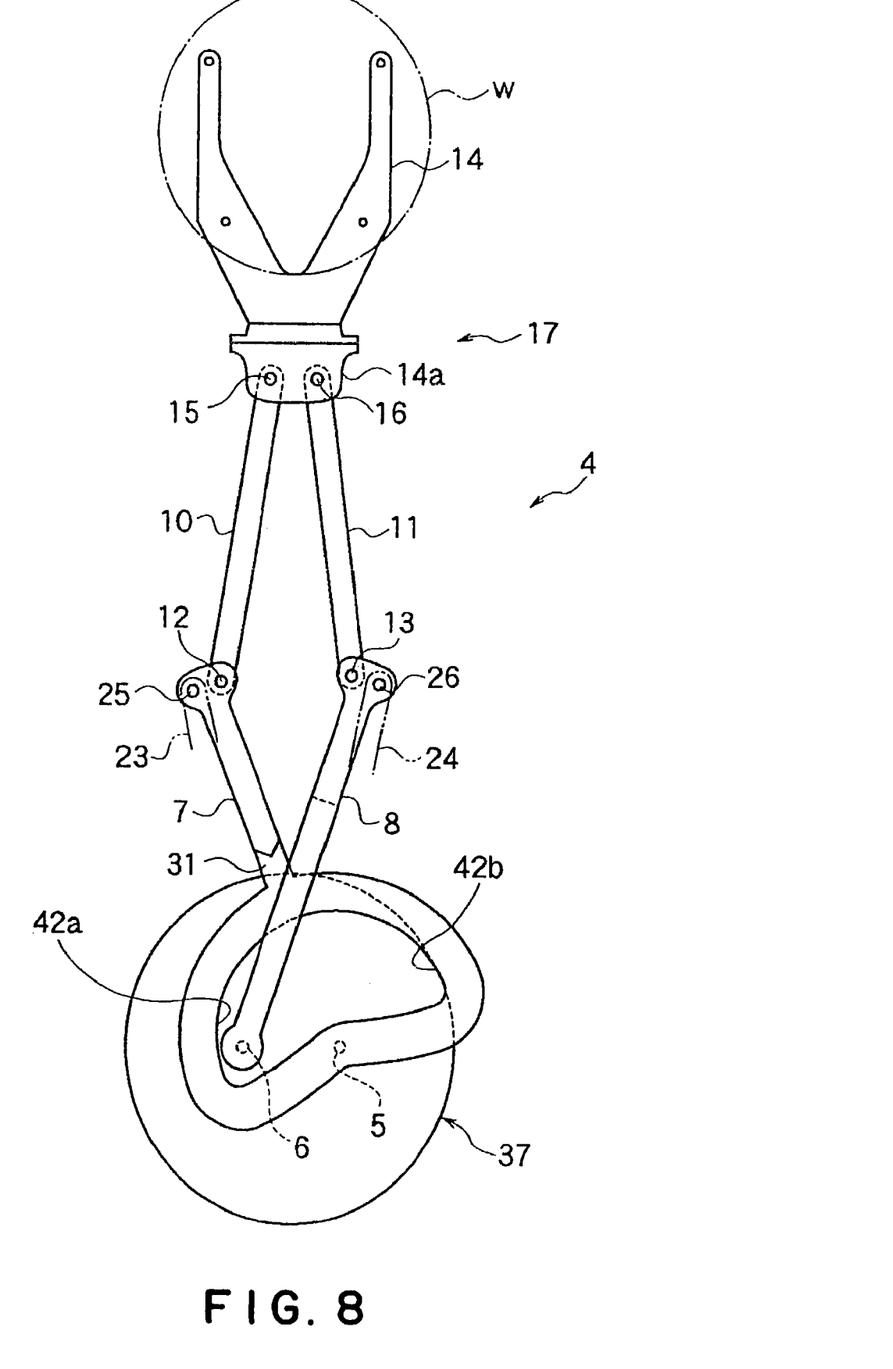
FIG. 8 is a plan view showing a state that a transfer arm is extended.

FIG. 6 is a plan view of the second preferred embodiment of a transfer apparatus according to the present invention. FIG. 7 is a longitudinal sectional view of FIG. 6, and FIG. 8 is a plan view showing a state that a transfer arm is extended. In this preferred embodiment, the same reference numbers are given to the same portions as those in the above described preferred embodiment, and the description thereof is omitted. The transfer apparatus 4 in this preferred embodiment has a transfer arm 17 which comprises: two rotating shafts 5 and 6 arranged in parallel; first arms 7 and 8, one end portions of which are fixed to the rotating shafts 5 and 6, respectively; second arms 10 and 11, one end portions of which are connected to the other end portions of the first arms 7 and 8 by means of pins 12 and 13, respectively; and a pick (holding portion) for holding a wafer W, the pick 14 being connected to the other end portions of the second arms 10 and 11 by means of pins 15 and 16, respectively.

On the tip end portions of the pair of second arms 10 and 11 rotatably connected to the base portion 14a of the pick 14 by means of the pins 15 and 16, a synchronism inverting means (not shown) is provided. The first arms 7 and 8 cross each other so as to increase the length of the transfer arm 17 when it is extended, without increasing the size of the transfer arm 17 when it is contracted.

In order to prevent the vertical dimension due to the vertical overlapping of the first arms 7 and 8 with each other in the crossing portion thereof, stepped portions 31 and 32 are preferably formed by cutting portions out of the overlapping surface of the crossing portion of the first arms 7 and 8 on the base end side thereof by half of the thickness. Since one first arm 7 is easy to interfere with the rotating shaft 6 of the other first arm 8 due to the crossing of the first arms 7 and 8, bypass portions 42a and 42b for preventing the one first arm 7 from interfering with the rotating shaft 6 of the other first arm 8 are provided. The bypass portions 42a and 42b are formed so as to be substantially U-shaped in order to bypass the rotating shaft 6 of the other first arm 8. While the two bypass portions 42a and 42b have been formed so as to be symmetrical on right and left sides with respect to the center line of the one first arm 7 in the shown embodiment, only one bypass portion, e.g. the bypass portion 42a, may be formed.

The transfer apparatus 4 may be a single type transfer apparatus having one transfer arm 17, or may be a dual type transfer apparatus having two transfer arms 17 and 30 in opposite directions by 180 degrees as this embodiment. In this case, it is assumed that the pick (holding portion) 14 is a first pick (holding portion) and the transfer arm 17 is a first transfer arm. Moreover, one end portions of third arms. 23 and 24 facing in directions opposite to the second arms 10 and 11 are connected to the other end portions of the first arms 7 and 8 by means of pins 25 and 26, respectively, and a second pick (holding portion) 27 for holding a wafer W is connected to the other end portions of the third arms 23 and 24 by means of pins 28 and 29, respectively. Thus, a second transfer arm 30 is formed.

FIG. 7 shows an example of a drive unit. This drive unit 37 comprises two electric motors 43 and 44 for driving the two parallel rotating shafts 5 and 6, respectively, and an electric motor 45 for pivoting the transfer arms 17 and 30 as a whole. The drive unit 37 has an outer stationary housing 46. In this stationary housing 46, a rotatable housing (rotatable portion) 47 housing therein the two motors 43 and 44 is rotatably provided, and the motor 45 for driving the rotatable housing 47 is provided. The two parallel rotating shafts 5 and 6 may be only driven so as to invert synchronism, since they carries out only the extending/contracting motion of the transfer arm unlike coaxial two rotating shafts. Therefore, a synchronism inverting means may be provided between the two rotating shafts 5 and 6, and one motor may be omitted. The transfer apparatus in this preferred embodiment can obtain the same advantageous effects of the transfer apparatus in the above described first preferred embodiment.

Figure 10:
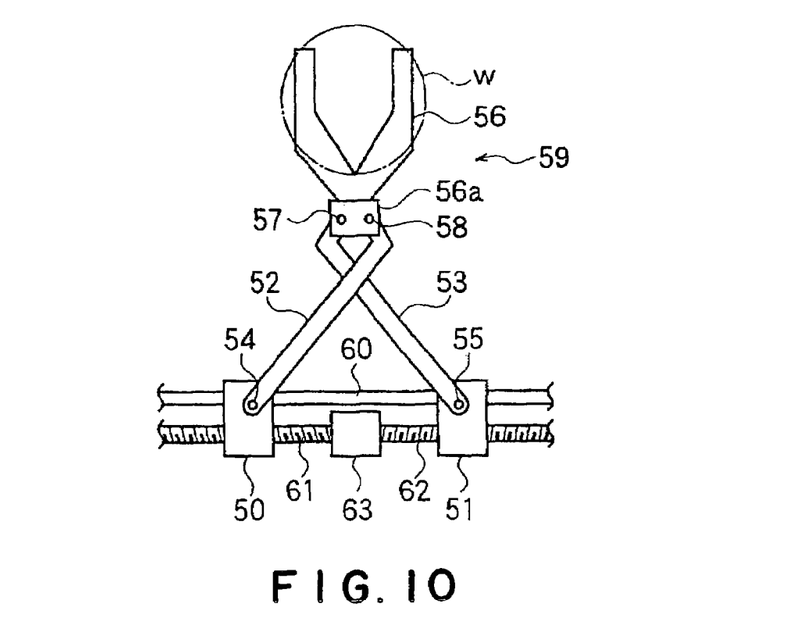
FIG. 10 is a plan view schematically showing the third preferred embodiment of a transfer apparatus according to the present invention.

FIG. 10 is a plan view schematically showing the third preferred embodiment of a transfer apparatus according to the present invention. The transfer apparatus in this preferred embodiment has a transfer arm 59 which comprises: a pair of movable bodies 50 and 51 which are moved so as to approach and leave each other; a pair of arms 52 and 53, one end portions of which are connected to the movable bodies 50 and 51 by means of pins 54 and 55, respectively; and a pick (holding portion) 56 for holding a wafer W, the pick 56 being connected to the other end portions of the arms 52 and 53 by means of pins 57 and 58, respectively. In order to cause the two movable bodies 50 and 51 to approach and leave each other, the body of the transfer apparatus is provided with a guide rail 60 for slidably guiding the movable bodies 50 and 51, and an electric motor 63 having screw shafts 61 and 62 on both end portions thereof. The movable bodies 50 and 51 engage screw shafts 61 and 62, respectively. The screw directions of the right and left screw shafts 62 and 61 are opposite to each other.

The tip end portions of the pair of arms 52 and 53 rotatably connected to the base end portion 56a of the pick 56 by means of the pins 57 and 58, respectively, are provided with a synchronism inverting means (not shown). In order to increase the length of the transfer arm 59 when it is extended, without increasing the size of the transfer arm 59 when it is contracted, the arms 52 and 53 cross each other. Also in the transfer apparatus in this preferred embodiment similar to the transfer apparatus in the above described preferred embodiments, it is possible to increase the length of the transfer arm 59 when it is extended, without increasing the size of the transfer arm 59 when it is contracted.

While the preferred embodiments of the present invention has been described in detail referring to the accompanying drawings, the present invention should not be limited to the above described preferred embodiments, but the invention can be modified in various ways without being beyond the scope of the invention. For example, the processing apparatus may be an atmospheric processing apparatus. The object to be processed may be an LCD substrate or a glass substrate in place of the semiconductor wafer. Both the first arms and the second arms may cross each other, respectively.

According to the present invention, the following advantageous effects can be obtained.

(1) According to a first aspect of the present invention, a transfer apparatus comprises a transfer arm which comprises: two rotating shafts arranged coaxially or in parallel; a pair of first arms, one end portions of which are fixed to the rotating shafts, respectively; a pair of second arms, one end portions of which are connected to the other end portions of the pair of first arms by means of pins, respectively; and a holding portion for holding an object to be processed, the holding portion being connected to each of the other end portions of the pair of second arms by means of pins, wherein the second arms cross each other. Therefore, it is possible to increase the length of the transfer arm when it is extended, without increasing the size of the transfer arm when it is contracted.

(2) In the first aspect of the present invention, the transfer apparatus may further comprise a second transfer arm which comprises: a pair of third arms which face in directions opposite to the second arms, one end portions of the third arms being connected to the other end portions of the pair of first arms by means of pins, respectively; and a second holding portion for holding the object to be processed, the second holding portion being connected to each of the other end portions of the pair of third arms by means of pins, wherein the third arms cross each other. Therefore, in the transfer apparatus having two transfer arms, it is possible to increase the length of the transfer arms when they are extended, without increasing the length of the size of the transfer arms when they are contracted.

(3) According to a second aspect of the present invention, a transfer apparatus comprising a transfer arm which comprises: two parallel rotating shafts; a pair of first arms, one end portions of which are fixed to the rotating shafts, respectively; a pair of second arms, one end portions of which are connected to the other end portions of the pair of first arms by means of pins, respectively; and a holding portion for holding an object to be processed, the holding portion being connected to each of the other end portions of the pair of second arms by means of pins, wherein the first arms cross each other. Therefore, it is possible to increase the length of the transfer arm when it is extended, without increasing the size of the transfer arm when it is contracted.

(4) In the second aspect of the present invention, the transfer apparatus may further comprise a second transfer arm which comprises: a pair of third arms which face in directions opposite to the second arms, one end portions of the third arms being connected to the other end portions of the pair of first arms by means of pins, respectively; and a second holding portion for holding the object to be processed, the second holding portion being connected to each of the other end portions of the pair of third arms by means of pins. Therefore, in the transfer apparatus having two transfer arms, it is possible to increase the length of the transfer arms when they are extended, without increasing the size of the transfer arms when they are contracted.

(5) In the second aspect of the present invention, one of the first arms may have a bypass portion for avoiding interference with a rotating shaft of the other of the first arms. Therefore, it is possible to avoid the interference of one of the first arms with the rotating shaft of the other first arm.

(6) According to a third aspect of the present invention, a transfer apparatus comprises a transfer arm which comprises: a pair of movable bodies which are moved so as to approach and leave each other; a pair of arms, one end portions of which are connected to the pair of movable bodies by pins, respectively; and a holding portion for holding an object to be processed, the holding portion being connected to each of the other end portions of the pair of arms by means of pins, wherein the arms cross each other. Therefore, it is possible to increase the length of the transfer arm when it is extended, without increasing the size of the transfer arm when it is contracted.

What is claimed is:

1. A transfer apparatus comprising a transfer arm which comprises:

two rotating shafts arranged coaxially or in parallel;

a pair of first arms, one end portions of which are fixed to said rotating shafts, respectively;

a pair of second arms, one end portions of which are connected to the other end portions of said pair of first arms by means of pins, respectively; and a holding portion for holding an object to be processed, said holding portion being connected to each of the other end portions of said pair of second arms by means of pins, wherein said second arms cross each other, wherein a distance between one of the other end portions of the pair of second arms and the other of the other end portions of the pair of second arms is fixed on the holding portion, and wherein each arm of the pair of first arms is composed of a single link arm and each arm of the second pair of second arms is composed of a single link arm.

2. A transfer apparatus as set forth in claim 1, which further comprises a second transfer arm which comprises:

a pair of third arms which face in directions opposite to said second arms, one end portions of said third arms being connected to the other end portions of said pair of first arms by means of pins, respectively; and a second holding portion for holding the object to be processed, said second holding portion being connected to each of the other end portions of said pair of third arms by means of pins, wherein said third arms cross each other.

3. A transfer apparatus comprising a first transfer arm and a second transfer arm, said first transfer arm including:

two parallel rotating shafts;

a pair of first arms, one end portions of which are fixed to said rotating shafts, respectively;

a pair of second arms, one end portions of which are connected to the other end portions of said pair of first arms by means of pins, respectively; and a holding portion for holding an object to be processed, said holding portion being connected to each of the other end portions of said pair of second arms by means of pins, wherein said first arms cross each other, and said second transfer arm including:

a pair of third arms which face in directions opposite to said second arms, one end portions of said third arms being connected to the other end portions of said pair of first arms by means of pins, respectively; and a second holding portion for holding the object to be processed, said second holding portion being connected to each of the other end portions of said pair of third arms by means of pins.

4. A transfer apparatus comprising a first transfer arm which comprises:

two parallel rotating shafts;

a pair of first arms, one end portions of which are fixed to said rotating shafts, respectively;

a pair of second arms, one end portions of which are connected to the other end portions of said pair of first arms by means of pins, respectively; and a holding portion for holding an object to be processed, said holding portion being connected to each of the other end portions of said pair of second arms by means of pins, wherein said first arms cross each other, and wherein one of said first arms has a bypass portion for avoiding interference with a rotating shaft of the other of said first arms.

5. A transfer apparatus comprising a transfer arm which comprises:

a pair of movable bodies which are moved so as to approach and leave each other;

a pair of arms, one end portions of which are connected to said pair of movable bodies by pins, respectively; and a holding portion for holding an object to be processed, said holding portion being connected to each of the other end portions of said pair of arms by means of pins, wherein said arms cross each other, and a distance between one of the other end portions of the pair of arms and the other of the other end portions of the pair of arms is fixed on the holding portion, and wherein each arm of the pair of arms is composed of a single link arm.

* * * * *